United States Patent [19]
Watanabe et al.

[11] Patent Number: 5,885,071
[45] Date of Patent: Mar. 23, 1999

[54] QUARTZ GLASS CRUCIBLE FOR PULLING SINGLE CRYSTAL

[76] Inventors: Hiroyuki Watanabe, Taishi Apartment No. 314, 4-1-13 Kitago; Tatsuhiro Sato, Taishi Apartment No. 222, 4-1-13 Kitago, both of Takefu City, Fukui 915, Japan

[21] Appl. No.: 812,843

[22] Filed: Mar. 6, 1997

[30] Foreign Application Priority Data

Mar. 18, 1996 [JP] Japan .................................. 8-060744

[51] Int. Cl.$^6$ .............................. F27B 14/10; B29D 22/00
[52] U.S. Cl. ......................... 432/264; 432/156; 432/263; 428/34.1
[58] Field of Search ................................. 65/17.1, DIG. 8, 65/374.1; 422/908, 245.1; 428/34.1, 36.1; 432/264, 262, 156

[56] References Cited

U.S. PATENT DOCUMENTS

| | | | |
|---|---|---|---|
| 4,528,163 | 7/1985 | Albrecht | 422/249 |
| 4,956,208 | 9/1990 | Uchikawa et al. | 428/34.6 |
| 5,174,801 | 12/1992 | Matsumura et al. | 65/18.1 |

FOREIGN PATENT DOCUMENTS 0 691 423 A  1/1996  European Pat. Off. .

OTHER PUBLICATIONS

K. Katsuhiko. Quartz glass crucible and its production. Publication No. 08–002932, Abstract, 09 Jan. 1996.

*Primary Examiner*—James C. Housel
*Assistant Examiner*—S. Devi
*Attorney, Agent, or Firm*—Whitman Breed Abbott & Morgan

[57] ABSTRACT

In order to reduce concentrations of impurities in an inner layer of a quartz crucible for pulling a silicon single crystal which comprises an outer layer made of quartz glass and an inner layer formed on the inner surface of the outer layer, a migration-preventing layer is formed between the outer and inner layers, wherein the migration-preventing layer prevents migration of the impurities such as alkaline metals included in the natural quartz glass in the outer layer to the synthetic quartz glass in the inner layer. The method of producing a crucible using a mold with an upper opening comprises the steps of: feeding a first quartz powder into the mold along an inner surface of the mold to pile up the first quartz powder in a layered structure and form a preform of the first quartz powder; melting a part of the preform by heat radiated from inside the preform; cooling the preform to solidify and form a crucible substrate of an opaque quartz glass layer; generating a high temperature gas atmosphere inside the substrate during or after formation of the substrate; feeding a second quartz powder containing aluminum or in combination with an aluminum-containing component into the gas atmosphere and melting it in the gas atmosphere; settling the second quartz powder melt flying from the gas atmosphere on an inner surface of the substrate to form an aluminum-containing intermediate quartz glass layer; feeding a third quartz powder into the gas atmosphere and melting it in the gas atmosphere; and it as settling the third quartz powder melt flying from the gas atmosphere on the inner surface of the aluminum-containing quartz glass layer to form a transparent quartz glass layer with high purity.

14 Claims, 2 Drawing Sheets

QUARTZ GLASS CRUCIBLE FOR PULLING SINGLE CRYSTAL

This application is a continuation of the Japanese application 8-60744 filed Mar. 18, 1996.

INDUSTRIAL FIELD OF APPLICATION

The present invention relates to a quartz glass crucible used for pulling a silicon crystal and producing the same. More particularly, the present invention relates to a quartz glass crucible comprising an outer layer of natural quartz glass and an inner layer of synthetic quartz glass and a method of producing same.

PRIOR ART

Conventionally, the Czochralski method has been widely used for producing a single crystal such as a semiconductor crystal. The method comprises the steps of: melting polycrystal silicon in a vessel to form a melt; dipping an end of a seed crystal into the melt and pulling the seed crystal from the melt, while rotating, to grow a single crystal having the same crystallographic orientation as that of the seed crystal on the end of the seed crystal. A quartz glass crucible is generally used as a vessel for pulling a single crystal.

In order to produce a high-purity quartz glass crucible, natural quartz powder which is purified with hydrofluoric acid or by a high temperature treatment has been conventionally used. With these treatments, however, in recent years a limitation has developed on the use of natural quartz powder purified in this way for producing a crucible requirement for higher purity in production of a semiconductor device has increased rapidly, but many impurities remain in the bulk of crucibles produced with natural quartz powder after the above treatments. High-purity synthetic quartz powder produced by the sol-gel method may be used for producing a crucible with purity as high as is required in current semiconductor device fabrication, but the synthetic quartz powder produced by that method is too expensive to be used in producing the whole body of a crucible.

In consideration of such circumstances, a method is proposed in U.S. Pat. No. 4,956,208; wherein an outer layer is formed with natural quartz glass and only an inner layer is formed with synthetic quartz glass. It is expected that the cost-related problem mentioned above is solved by means of the method, since highly-expensive, high-purity synthetic quartz powder is only used in forming the inner surface of a crucible. However it was found that such a thin layer is not sufficient to prevent the pollution of the silicon melt by impurities.

SUMMARY OF THE INVENTION

The object of the present invention is thereof includes to provide a high-purity quartz glass crucible having an inner layer with impurities at very low concentration and to provide simple and inexpensive method of producing the same.

A crucible according to the present invention comprises an outer layer made of quartz glass and an inner layer made of quartz glass, wherein an intermediate layer for preventing migration of impurities such as alkaline metals is sandwiched between the outer and inner layers.

A first aspect of the present invention is directed to a method of producing a crucible for pulling a silicon single crystal comprising a quartz glass layer as outer layer, a quartz glass layer as inner layer, and an intermediate layer of quartz glass, containing aluminum for preventing migration of impurities between the outer and inner layers.

According to the invention the method of producing the quartz glass crucible comprises the following steps: feeding a first quartz powder into the mold along an inner surface of the mold to pile up the first quartz powder in a layered structure and form a preform of the first quartz powder; melting a part of the preform by heat radiated from inside the preform; cooling the preform to solidify and form a crucible substrate of an opaque quartz glass layer; generating a high temperature gas atmosphere inside the substrate during or after formation of the substrate; feeding a second quartz powder containing the aluminum or in combination with an aluminum-containing component, into the gas atmosphere and melting it in the gas atmosphere; settling the second quartz powder melt flying from the gas atmosphere on an inner surface of the substrate to form an aluminum-containing intermediate quartz glass layer; feeding a third quartz powder into the gas atmosphere and melting it in the gas atmosphere; and settling the third quartz powder melt from the gas atmosphere on the inner surface of the aluminum-containing quartz glass layer to form a transparent quartz glass layer with high purity. It has been found that in the known crucibles, some of alkaline metal impurities in natural quartz powder can migrate to the inner layer from the outer layer through the bulk of a crucible even after the completion of the crucible. When a crucible is used in an extended pulling operation at high temperature, some impurities migrate up to the inner surface of the crucible and accelerate crystallization of quartz glass at its inner surface. As the result of the crystallization, the crystals from quartz glass seel off into silicon melt in the crucible from the inner surface, causing dislocations or other defects in a growing crystal. What's worse, the impurities dissolve into the silicon melt and are then incorporated into the growing crystal to deteriorate its quality.

The aluminum containing layer prevents migration of impurities between the inner and the outer layers, making it possible to use for the outer layer a quartz glass powder, having a low purity, as for example natural quartz glass powder.

According to the invention the intermediate layer is formed by the same method for forming the inner layer. The method according to the invention is consequently easy therefore to perform. Regarding the method for making the inner layer, the difference in making the intermediate layer is that the second quartz powder contains aluminum, or is fed in combination with an aluminum-containing component, into the gas atmosphere. By this method a homogeneous distribution of aluminum in the intermediate layer is achieved.

In a preferred embodiment, a migration-preventing, intermediate layer can be formed by feeding a mixture of synthetic quartz powder with aluminum oxide powder to melt, or feeding the synthetic quartz powder and the aluminum oxide powder independently to melt after mixing them in the gas atmosphere. In another embodiment, synthetic quartz powder, each grain of which is coated with an aluminum, compound or doped with aluminum is fed to form a migration-preventing, intermediate layer after melting. In still another embodiment, synthetic quartz powder and a liquid aluminum compound are independently fed mixed, and then melted to finally form a migration-preventing, intermediate layer.

A second aspect of the present invention is directed to a quartz glass crucible for pulling a silicon single crystal, which comprises an outer layer of quartz glass, an inner layer having very small impurities formed on an inner surface of the outer layer, and an intermediate layer which has a high concentration of aluminum, and which lies between the outer and inner layers.

In a preferred embodiment of the second aspect, a concentration of aluminum in the migration-preventing layer is set at a value equal to 1 to 100 times the total number of atoms of alkaline metals per unit volume of the natural quartz glass in the outer layer. In a more preferred embodiment, a concentration of aluminum in the migration-preventing layer is set at a value equal to 5 to 50 times the total number of atoms of alkaline impurities per unit volume of the natural quartz glass in the outer layer.

The aluminum containing layer prevents migration of impurities between the inner and the outer layers. Therefore it is possible to use a quartz glass powder for making the outer layer, such a low purity, such as for example natural quartz glass powder.

In a preferred embodiment of the quartz glass crucible the outer layer is made from natural quartz glass, and the inner layer and the intermediate layer are made from synthetic quartz glass. Using natural quartz glass for the outer layer reduces costs and using synthetic quartz results in a high purity of the inner layer. For thus reason the intermediate layer should be made by using synthetic quartz powder.

The number of aluminum atoms in the migration-preventing, intermediate layer is preferably equal to 1 to 100 times of a total number of atoms of alkaline metals per unit volume of the quartz glass in the outer layer. In a more preferred case, the number of aluminum atoms is set in the range of 5 to 50 times the total number of atoms of alkaline metals per unit volume of the quartz glass in the outer layer. Thickness of the migration-preventing, intermediate layer is preferably 0.3 mm or more, or more preferably 0.5 mm or more. If the thickness of the intermediate layer is lower than 0.3 mm, the concentration of aluminum has to be locally high, which causes devitrification in quartz glass. The upper limit of a thickness should be 3 to 4 mm, which is usually thick enough for practical use.

In the present invention, it is preferable that an outer layer is made of opaque quartz glass containing bubbles and an inner layer of transparent quartz glass having a predetermined thickness and being substantially free of bubbles, as disclosed in U.S. Pat. No. 4,956,208.

DETAILED DESCRIPTION OF THE PREFERRED EMBODIMENTS

Figure 1:
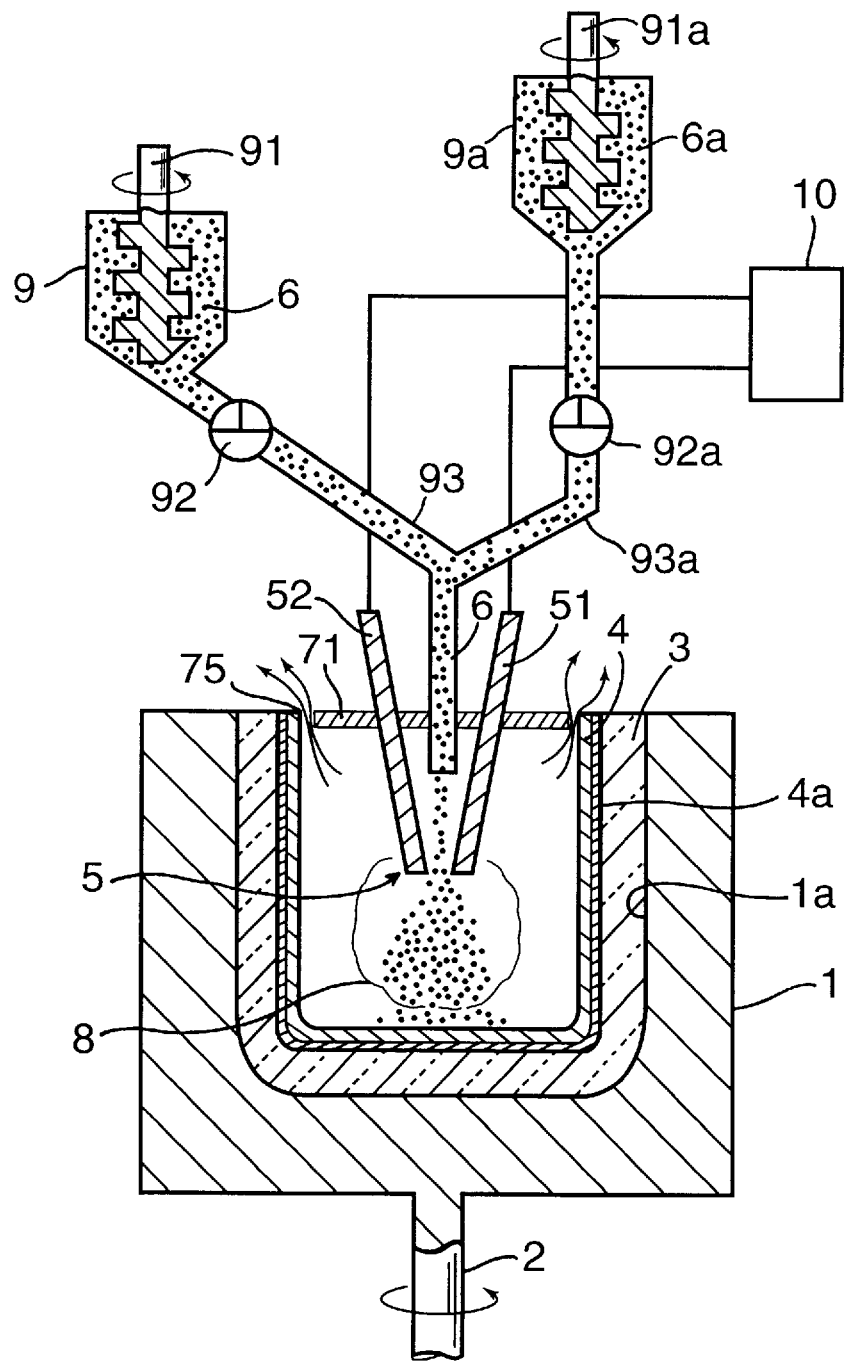
FIG. 1 is a schematic sectional view of an apparatus of producing a quartz crucible for embodiment of a method according to the present invention.

In FIG. 1, a rotary mold 1 is mounted on a rotary shaft 2. A cavity 1a is formed in the mold 1. A crucible substrate 3 is positioned in the cavity 1a, which substrate 3 is made of opaque natural quartz glass and has the role of an outer layer. The crucible substrate 3 is produced through the steps of: feeding natural quartz powder into the rotating mold 1 to uniformly disperse the powder along an inner surface of the mold 1 and form a preform of the powder in a layered structure having the shape of a desired crucible; melting the preform by heat radiated from inside the preform; and cooling the preform. An arc discharge device 5 having electrodes 51, 52 connected to an electric source 10, as shown in FIG. 1, can be used to radiate the heat from inside the preform. A plasma arc discharge device may also be used as a substitute for the arc discharge device. A further detailed description on production of a crucible substrate appears in U.S. Pat. No. 4,956,208.

The apparatus shown in FIG. 1 is equipped with a first supply tank 9 for quartz powder which contains synthetic quartz powder 6 used for formation of inner layer 4, wherein the first supply tank 9 of the apparatus in FIG. 1 is located above the mold 1. The first supply tank 9 is connected to a discharge pipe 93 with a measuring feeder 92 in the pipe 93. A stirring blade 91 is inserted in the supply tank 9. In the apparatus, a second supply tank 9a is also equipped above the mold 1, which is shown in the right, upper area of FIG. 1. Synthetic quartz powder already doped with aluminum in a predetermined concentration is held in the second supply tank 9a. The second supply tank 9a is connected to a discharge pipe 93a with a measuring feeder 92a in the pipe 93a. The discharge pipes 93 and 93a converged into a head pipe, marked as 93, which is inserted into the cavity 1a. In the second supply tank 9a, a stirring blade 91a is inserted. The upper opening of the mold 1 is covered that has a cover 71 with an annular slit 75.

After the crucible substrate 3 is formed, the following process is preformed, comprising the steps of: in or after formation of the substrate 3, feeding doped synthetic quartz powder 6a with aluminum at a predetermined concentration through the discharge pipe 93a while adjusting the second measuring feeder 92a into the inner space of the substrate 3, wherein, during the period of feeding of the doped synthetic quartz powder, the arc discharge between the carbon electrodes 51, 52 is kept working for generating heat, and the first measuring feeder 92 is closed. In such conditions, a high temperature gas atmosphere 8 is generated inside the substrate 3 and the doped synthetic quartz powder 6a is fed into the gas atmosphere 8.

The doped synthetic quartz powder 6a with aluminum is fed into the gas atmosphere 8 to melt at least part of the powder by the heat of the gas atmosphere 8 during the passage through the gas atmosphere 8 and the powder is settled flying from the gas atmosphere 8 on an inner surface of the substrate 3 to form a migration-preventing layer 4a which is integrated with the substrate 3. The layer has a high concentration of aluminum and acts as a layer for preventing migration of impurities. A thickness of the layer 4a is at least 0.3 mm, or preferably 0.5 mm or more and should not be thicker than 4 mm. In order to uniformly form the layer 4a across the inner surface of the substrate 3, thing the arc discharge device 5 and the tip of the head pipe 93 are moved around in a determined spatial relation must be at a proper height along the inner surface of the substrate 3 to form the layer 4a.

Next, the second measuring feeder 92a is closed which is used for feeding the doped synthetic quartz powder with aluminum. Instead, the first measuring feeder 92 for feeding synthetic quartz powder 6 is opened at an adjusted degree to feed only the synthetic quartz powder 6 through the discharging pipe 93 and to form an inner layer 4 which is substantially free of bubbles. The method of forming the inner layer is discussed in more detail in the publication of above-mentioned Examined Japanese Patent Application No. Hei 4-22861.

Figure 2:
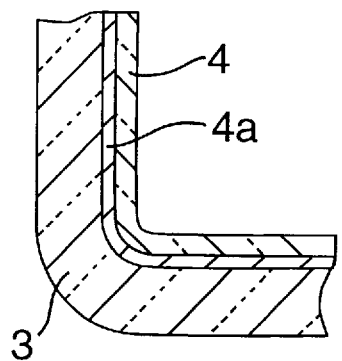
FIG. 2 is a fragmentary sectional view of a quartz crucible produced by a method of the present invention.

In FIG. 2, a fragmentary sectional view of a crucible produced by the method mentioned above is shown. A crucible according to the present invention comprises an outer layer, namely a substrate 3, which is melted to form by heat radiated from an inner space, an inner layer which is formed by feeding synthetic quartz powder into a high temperature gas atmosphere 8 to melt, disperse and settle the powder on the inner surface of the substrate 3, and a migration-preventing layer 4a as inner layer having a high aluminum concentration formed between the outer layer and inner layers 3, 4. The outer layer 3 is preferably formed as a opaque quartz glass layer with a high bubble content, as disclosed in U.S. Pat. No. 4,956,208. The inner layer 4 is preferably formed substantially free of bubbles, as disclosed in the same publication.

The migration-preventing intermediate layer 4a has the function that the layer 4a stops migration of alkaline metals such as lithium of the natural quartz glass in the outer layer 3 to the exposed surface of the inner layer, wherein lithium is one of the alkali metals contained as impurities in natural quartz of the raw material for the outer layer 3. Aluminum in the migration-preventing layer 4a is in the electrically negative state, captures and electrically neutralizes an alkaline metal which is migrating to the inner layer 4 from the outer layer 3. As a result, an alkaline metal atom is prevented from reaching the inner layer. For thus purpose, it is preferred that the layer 4a has a concentration of aluminum as high as 1 to 100 times, or preferably 5 to 50 times the total number of atoms of alkaline metals per unit volume of the natural quartz glass in outer layer 3 where the concentration of aluminum is lower than the lower limit of one times the number of a alkaline matal atoms, the aluminum atoms cannot work as satisfy the purpose of the present invention and, on the other hand, where concentration is higher than the upper limit of 100 times, the aluminum atoms tend can adversely act on the quartz glass itself and accelerate its devitrification.

In the embodiments shown above, doped synthetic quartz powder 6a with aluminum is fed into a high temperature gas atmosphere 8, but a mixture of synthetic quartz powder and aluminum oxide powder may also be contained in the supply tank 9a. It is also an alternative that aluminum oxide powder can be charged in the second supply tank 9a, synthetic quartz powder can be charged in the first supply tank 9, and both powders fed, after mixing, into the gas atmosphere. As a further alternative, synthetic quartz powder coated with an aluminum compound may be used. Such a coated powder can be obtained by a process in which quartz powder immersing in an aqueous solution of the aluminum compound and then drying the powder.

In an above embodiments, the aluminum oxide powder 6a which is fed from the second supply tank 9a is preferably sent through the discharge pipe 93a carried on a stream of nitrogen gas in order to prevent the powder from being agglomerated in the apparatus in FIG. 1. A liquid aluminum compound may be used as a dopant instead. Where a liquid aluminum compound is used, thus one of the possible ways that the liquid aluminum compound is supplied from the second supply tank 9a and synthetic quartz powder is supplied from the first supply tank 9.

As described above, according to the present invention, a migration-preventing layer 4a is formed between the outer layer 3 and the inner layer 4 and thereby migration of impurities such as alkaline metals to the synthetic quartz glass in the inner layer 4 from the natural quartz glass in the outer layer 3 is prevented. As a result, the inner layer 4 can be protected so as state of maintain a very low concentration of impurities. Moreover, this favorable condition can be maintained during pulling a silicon single crystal.

EXAMPLE

A crucible with a 22 inch in inner diameter was produced with the use of the apparatus shown in FIG. 1. In production, 20 kg of natural quartz powder was fed into the cavity 1a of the rotating mold 1 and a preform was formed in the shape of an outer layer 3. The preform was heated and molten in its inner surface region to form the outer layer 3. On the other hand, in parallel to formation of the outer layer, 1 kg of doped synthetic quartz powder 6a with aluminum at a concentration of 500 ppm equal to about 10 times of the total number of atoms of alkaline metals per unit volume of the natural quartz glass in the outer layer 3 was fed into a high temperature gas atmosphere 8 to form a migration-preventing layer 4a with a thickness of about 0.4 mm on the outer layer 3. Thereafter, an inner layer 4 was formed by feeding 3 kg of synthetic quartz powder in a way as described in the general description of the preferred embodiments above. Concentrations of impurities were measured in samples from the outer and inner layers 3, 4 of the resulting crucible. The results are shown in a Table 1.

TABLE 1

|  |  | (unit: ppm) | | | |
| --- | --- | --- | --- | --- | --- |
|  |  | AL | K | Li | Na |
| Example | Inner layer | <1 | <0.01 | <0.01 | <0.01 |
|  | Outer layer | 17 | 0.21 | 0.79 | 0.01 |
| Comp. Ex. | Inner layer | <1 | 0.02 | 0.21 | 0.01 |
|  | Outer layer | 17 | 0.22 | 0.78 | 0.01 |

Comparative Example

A quartz crucible was produced with the use of the apparatus shown in FIG. 1 in the same conditions as those in the above example, with the exception that a migration-preventing layer with a high aluminum concentration is not inserted between outer and inner layers 3, 4. Concentrations of impurities were measured on samples from the outer and inner layers 3, 4 of the crucible produced, which results are shown in a Table 1.

As seen from Table 1, concentrations of impurities, especially lithium, in the inner layer 4 of the crucible obtained by the method of the present invention are conspicuously decreased. This is because migration of impurities, especially lithium, in the natural quartz glass in the outer layer 3 to the inner layer of synthetic quartz glass was restricted by aluminum in the migration-preventing intermediate layer 4a.

We claim:

1. A quartz glass crucible for pulling a silicon single crystal, said crucible comprising an outer layer of quartz glass, an inner layer of quartz glass, and an aluminum-containing intermediate layer of quartz glass between the outer and inner layers, said intermediate layer preventing migration of impurities between the outer and inner layers.

2. A quartz glass crucible as claimed in claim 1, wherein the outer layer is made from natural quartz glass, and the inner layer and the intermediate layer are made from synthetic quartz glass.

3. A quartz glass crucible as claimed in claim 1, wherein the number of aluminum atoms in the aluminum-containing intermediate layer is equal to 1 to 100 times the total number of atoms of alkaline metals in a unit volume of the outer layer.

4. A quartz glass crucible as claimed in claim 2, wherein the number of aluminum atoms in the aluminum-containing intermediate layer is equal to 5 to 50 times the total number of atoms of alkaline metals in a unit volume of the outer layer.

5. A quartz glass crucible as claimed in claim 1, wherein the thickness of the intermediate layer is 0.3 mm or more.

6. A quartz glass crucible as claimed in claim 1, wherein the outer layer is made of opaque quartz glass containing bubbles and the inner layer is made of transparent quartz glass being substantially free of bubbles.

7. A quartz glass crucible as claimed in claim 2, wherein the number of aluminum atoms in the aluminum-containing intermediate layer is equal to 1 to 100 times the total number of atoms of alkali metal per unit volume of the outer layer.

8. A quartz glass crucible as claimed in claim 1, wherein the number of aluminum atoms in the aluminum-containing intermediate layer is equal to 5 to 50 times the total number of atoms of alkali metal per unit volume of the outer layer.

9. A quartz glass crucible as claimed in claim 2, wherein the thickness of the intermediate layer is 0.3 mm or more.

10. A quartz glass crucible as claimed in claim 2, wherein the outer layer is made of opaque quartz glass containing bubbles and the inner layer is made of transparent quartz glass being substantially free of bubbles.

11. A quartz glass crucible as claimed in claim 3, wherein the thickness of the intermediate layer is 0.3 mm or more.

12. A quartz glass crucible as claimed in claim 8, wherein the thickness of the intermediate layer is 0.3 mm or more.

13. A quartz glass crucible for pulling a single crystal containing silicon from a melt, said crucible comprising:

an outer layer formed from natural quartz glass, said outer layer having bubbles therein and being shaped to define an inside of the crucible;

an intermediate layer inside and adjacent the outer layer, said intermediate layer being of synthetic quartz glass and containing aluminum atoms, said aluminum atoms being present in said synthetic quartz glass in a number that is in the range of 1 to 100 times the total number of atoms of alkali metal per unit volume in the glass of the outer layer, said intermediate layer having an inward to outward thickness of at least 0.3 mm; and an inner layer adjacent to and inward of the intermediate layer, said inner layer contacting the melt and being formed of synthetic quartz glass, said intermediate layer blocking the migration of impurities in said outer layer to said inner layer.

14. The crucible of claim 13, wherein the aluminum atoms in the glass of the intermediate layer are in the range of 5 to 50 times the total number of atoms of alkali metal per unit volume in the glass of the outer layer.

* * * * *